United States Patent
Lin et al.

(10) Patent No.: US 8,809,673 B2
(45) Date of Patent: * Aug. 19, 2014

(54) STACKED PHOTOVOLTAIC CELL MODULE

(75) Inventors: Chun-Liang Lin, New Taipei (TW);
Hsin-Rong Tseng, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 73 days.

This patent is subject to a terminal disclaimer.

(21) Appl. No.: 13/091,170

(22) Filed: Apr. 21, 2011

(65) Prior Publication Data

US 2012/0167965 A1 Jul. 5, 2012

(30) Foreign Application Priority Data

Dec. 31, 2010 (TW) ................................ 99147242 A

(51) Int. Cl.
*H01L 31/00* (2006.01)
*H01L 27/30* (2006.01)
(52) U.S. Cl.
CPC .................................... *H01L 27/302* (2013.01)
USPC ........................................................ 136/255
(58) Field of Classification Search
CPC ................................ H01l 27/302; H01l 27/00
USPC ................................................. 136/243–265
See application file for complete search history.

(56) References Cited

U.S. PATENT DOCUMENTS

| | | | |
|---|---|---|---|
| 6,215,061 B1 * | 4/2001 | Kariya ........................ | 136/256 |
| 6,657,378 B2 | 12/2003 | Forrest et al. | |
| 7,205,585 B2 | 4/2007 | Forrest et al. | |
| 7,326,955 B2 * | 2/2008 | Forrest et al. ................... | 257/40 |
| 7,816,715 B2 | 10/2010 | Forrest et al. | |
| 2005/0031899 A1 * | 2/2005 | Nomura et al. ............... | 428/690 |
| 2009/0078316 A1 * | 3/2009 | Khazeni et al. ............... | 136/257 |
| 2010/0282297 A1 * | 11/2010 | Sekimoto et al. ............. | 136/246 |

* cited by examiner

*Primary Examiner* — Jeffrey T Barton
*Assistant Examiner* — Niki Bakhtiari
(74) *Attorney, Agent, or Firm* — Jianq Chyun IP Office

(57) ABSTRACT

A stacked photovoltaic cell module includes, sequentially stacked, a substrate, a first electrode layer, a first carrier transport layer, a first light absorption layer, a connecting layer with a reflectivity of 10-60%, a second carrier transport layer, a second light absorption layer, and a second electrode layer. The second carrier transport layer has a first refraction index n1 and a first thickness D1, and the second light absorption layer has a second refraction index n2 and a second thickness D2, and the second carrier transport layer and the second light absorption layer satisfy $\Phi 1+\Phi 2-2\pi(n1D1+n2D2)/\lambda=2m\pi$. $\Phi 1$ represents a reflective phase difference between the second electrode layer the second light absorption layer, $\Phi 2$ represents a reflective phase difference between the second carrier transport layer and second light absorption layer, $\lambda$ represents an absorption wavelength of the first light absorption layer, and m represents 0 or an integer.

15 Claims, 4 Drawing Sheets

STACKED PHOTOVOLTAIC CELL MODULE

CROSS-REFERENCE TO RELATED APPLICATION

This application claims the priority benefit of Taiwan application serial no. 99147242, filed on Dec. 31, 2010. The entirety of the above-mentioned patent application is hereby incorporated by reference herein and made a part of this specification.

BACKGROUND OF THE INVENTION

1. Field of the Invention

The disclosure is related to a photovoltaic cell module, and in particular to a stacked organic photovoltaic (OPV) cell module.

2. Description of Related Art

In recent years, due to high environmental awareness, in order to deal with shortage of fossil fuels and to reduce the impact of fossil fuels on the environment, the development of alternative energy and renewable energy has become a popular issue. Among the various energy types, photovoltaic cells have gained the most attention. This is because photovoltaic cells are able to directly convert solar energy into electrical power, and no harmful substances such as carbon dioxide or nitrides are produced during power generation and thus no pollution is released into the environment.

In general, in a conventional photovoltaic cell, a first electrode, an active layer, and a second electrode layer are formed on a substrate. When light irradiates the photovoltaic cell, the active layer is affected by photo energy and generates free electron-hole pairs, wherein electrons and holes respectively move towards the two electrode layers due to an electrical field between the two electrode layers, thereby generating a storage state of electrical energy. If a load circuit or an electronic device is externally added electrical power is provided to and drives the circuit or device.

However, the greatest problem facing photovoltaic cells is that a light absorption rate or power output is limited. Therefore, there has been active development in trying to increase the light absorption rate and power output or photovoltaic cells.

SUMMARY OF THE INVENTION

The disclosure provides a stacked photovoltaic cell module which increases a light absorption rate and power output of photovoltaic cells, thereby enhancing overall efficiency of the photovoltaic cell module.

The disclosure provides a stacked photovoltaic cell module which includes a substrate, a first electrode layer on the substrate, a first light absorption layer on the first electrode layer, a connecting layer on the first light absorption layer, a second carrier transport layer on the connecting layer, a second light absorption layer on the second carrier transport layer, and a second electrode layer on the second light absorption layer. In particular, the connecting layer has a reflectivity of about 10-60%. In addition, the second carrier transport layer has a first refraction index n1 and a first thickness D1, the second light absorption layer has a second refraction index n2 and a second thickness D2, and the second carrier transport layer and the second light absorption layer satisfy $\Phi_1 + \Phi_2 - 2\pi(n_1 D_1 + n_2 D_2)/\lambda = 2m\pi$. $\Phi_1$ represents a reflective phase difference between the second electrode layer the second light absorption layer, $\Phi_2$ represents a reflective phase difference between the connecting layer and the second carrier transport layer, $\lambda$ represents an absorption wavelength of the first light absorption layer, and m represents 0 or an integer.

In summary, in the stacked photovoltaic cell module according to the disclosure, the connecting layer has the reflectivity of about 10-60%, and the second carrier transport layer and the second light absorption layer satisfy $\Phi_1 + \Phi_2 - 2\pi(n_1 D_1 + n_2 D_2)/\lambda = 2m\pi$, wherein $\Phi_1$ represents the reflective phase difference between the second electrode layer and the second light absorption layer, $\Phi_2$ represents the reflective phase difference between the connecting layer and the second carrier transport layer, $\lambda$ represents the absorption wavelength of the first light absorption layer, and m represents 0 or an integer. Hence, an optical resonance cavity structure is formed between the second electrode layer and the connecting layer, and the light absorption rate of the second light absorption layer is increased. Therefore, external light is able to be uniformly absorbed by the first light absorption layer and the second light absorption layer after entering the photovoltaic cell module, so that the total output current and the total output power of the stacked photovoltaic cell module are increased.

In order to make the aforementioned and other objects, features and advantages of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
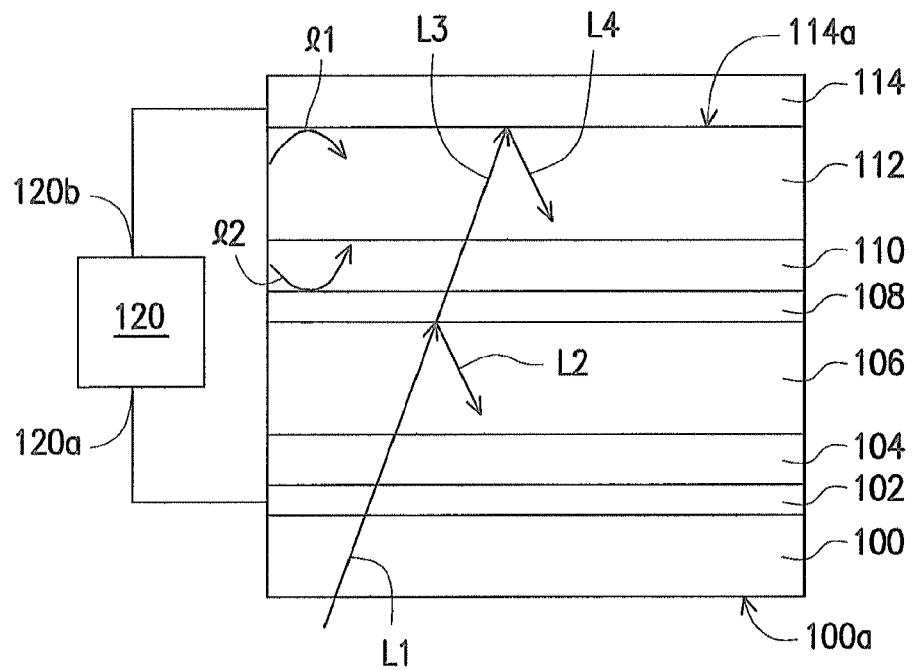
FIG. 1 is a schematic cross-sectional diagram showing a stacked photovoltaic cell module according to an embodiment of the disclosure.

FIG. 1 is a schematic cross-sectional diagram showing a stacked photovoltaic cell module according to an embodiment of the disclosure. Referring to FIG. 1, a stacked photovoltaic cell module according to the present embodiment includes a substrate 100, a first electrode layer 102, a first light absorption layer 106, a connecting layer 108, a second carrier transport layer 110, a second light absorption layer 112, and a second electrode layer 114. According to an embodiment of the disclosure, the stacked photovoltaic cell module preferably includes a first carrier transport layer 104.

The substrate 100 may be a non-flexible substrate (such as a glass substrate) or a flexible substrate (such as an organic polymer substrate). A flexible substrate is more preferable. If the substrate 100 is a flexible substrate, a stacked photovoltaic cell module 10 according to the present embodiment may be fabricated through a roll to roll process.

The first electrode layer 102 is located on the substrate 100. According to the present embodiment, the first electrode layer 110 includes a transparent electrode material, such as indium tin oxide, indium zinc oxide, aluminum tin oxide, aluminum zinc oxide, indium germanium zinc oxide, or another suitable metal oxide.

The first carrier transport layer 104 is located on the first electrode layer 102. The first carrier transport layer 104 is mainly used for facilitating transport of carriers generated by the first light absorption layer 106 to the first electrode layer 102. The first carrier transport layer 104 may also be further used for enabling the first electrode layer 102 to have a suitable work function relative to the first light absorption layer 106. According to an embodiment, a material of the carrier transport layer 104 includes, for example, cesium carbonate ($Cs_2CO_3$), Poly(3,4-ethylenedioxythiophene): poly(styrenesulfonate) (PEDOT: PSS), zinc oxide (ZnO), or another carrier transport material. A thickness of the first carrier transport layer 104 is, for example, 20-100 nm.

The first light absorption layer 106 is located on the first carrier transport layer 104. The first light absorption layer 106 absorbs light with a first wavelength range. According to the present embodiment, the first light absorption layer 106 is, for example, an organic light absorption material, and mainly absorbs light with the visible light band (for example, about 300-700 nm), or absorbs light with the infrared light band (for example, about 600-1100 nm). A thickness of the first light absorption layer 106 is, for example, about 60-100 nm.

If the first light absorption layer 106 absorbs light with the visible light band (for example, about 300-700 nm), a material thereof may include (poly(3-hexylthiophene):[6,6]-phenyl-C61-butyric acid methyl ester (P3HT:[60]PCBM), (poly[2-methoxy-5-(30,70-dimethyloctyloxy)-1,4-phenylenevinylene]:[6,6]-phenyl-C61-butyricacidmethyl ester (MDMO-PPV:[60]PCBM), or another suitable material.

If the first light absorption layer 106 absorbs light with the infrared light band (for example, about 600-1100), a material thereof may include (poly[2,6-(4,4-bis-(2-ethylhexyl)-4H-cyclopenta[2,1-b;3,4-b']dithiophene)-alt-4,7-(2,1,3-benzothiadiazole)]:[6,6]-phenyl-C71 butyric acid methyl ester (PCPDTBT:[70]PCBM), (poly[4,8-bis-substituted-benzo[1,2-b:4,5-b']dithiophene-2,6-diyl-alt-4-substituted-thieno[3,4-b]thio-phene-2,6-diyl]:[6,6]-phenyl-C71 butyric acid methyl ester (PBDTTT:[70]PCBM), or another suitable material.

The connecting layer 108 is located on the first light absorption layer 106. According to the present embodiment, the connecting layer 108 has a reflectivity of 10-60%. In order that the connecting layer 108 electrically connects the two layers above and below, a material of the connecting layer 108 is preferably a metal material. In addition, in order that the connecting layer 108 has a reflectivity of about 10-60%, a thickness of the connecting layer 108 cannot be too thick and should preferably be about 5-25 nm. For example, if the material of the connecting layer 108 is silver, the thickness thereof may be adjusted to about 10-15 nm. If the material of the connecting layer 108 is aluminum, the thickness thereof may be adjusted to about about 5-10 nm.

The second carrier transport layer 110 is located on the connecting layer 108. The second carrier transport layer 110 is mainly used for facilitating transport of carriers generated by a photovoltaic cell to the electrode layer. Similarly, the second carrier transport layer 110 may also be further used for enabling the connecting layer 108 to have a suitable work function relative to the second light absorption layer 112. According to an embodiment, a material of the second miler transport layer 110 includes, for example, $Cs_2CO_3$, PEDOT: PSS, ZnO, $MoO_3$, or another suitable material.

The second light absorption layer 112 is located on the second carrier transport layer 110. The second light absorption layer 112 absorbs light with a second wavelength range. According to the present embodiment, the second light absorption layer 112 is, for example, an organic light absorption material, and mainly absorbs light with the infrared light band (for example, about 600-1100 nm), or absorbs light with the visible light band (for example, about 300-700 nm). If the second light absorption layer 112 absorbs light with the visible light band (for example, about 300-700 nm), a material thereof may include P3HT:[60]PCBM, MDMO-PPV:[60]PCBM, or another suitable material. If the second light absorption layer 112 absorbs light with the infrared light band (for example, about 600-1100 nm), a material thereof may include PCPDTBT:[70]PCBM, PBDTTT:[70]PCBM, or another suitable material.

Figure 3:
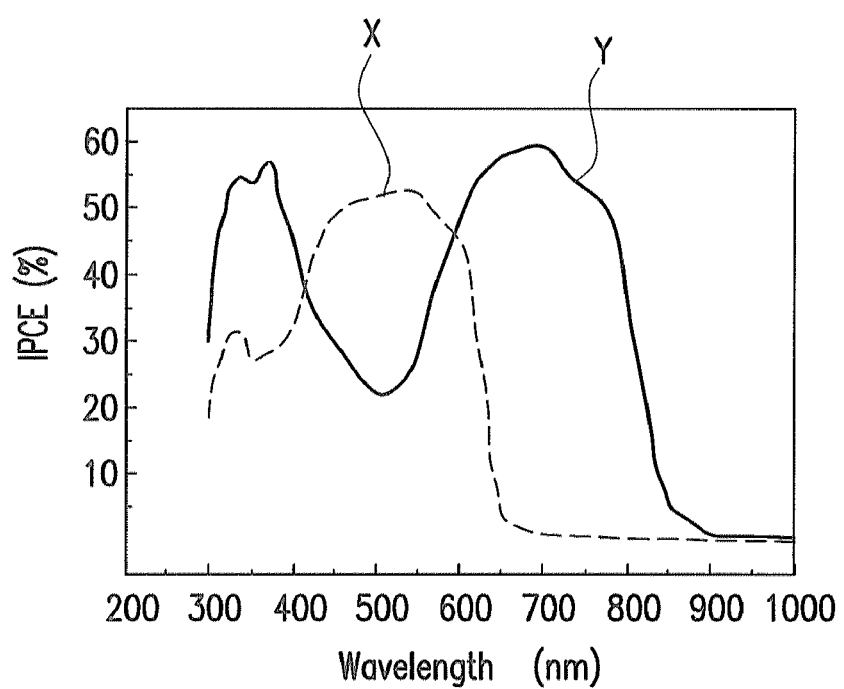
FIG. 3 is a diagram showing curves which represent light absorption bands of a stacked photovoltaic cell module according to an embodiment of the disclosure.

It should be noted that the second light absorption layer 112 and the first light absorption layer 106 absorb light beams with different wavelength ranges. In FIG. 3, the vertical axis represents incident photon conversion efficiency (IPCE(%)), and the horizontal axis represents wavelengths. If the first light absorption layer 106 absorbs light with the visible light band (for example, a curve X), the second light absorption layer 112 absorbs light with the infrared light band (for example, a curve Y). Alternatively, if the first light absorption layer 106 absorbs light with the infrared light band (for example, the curve Y), the second light absorption layer 112 absorbs light with the visible light band (for example, the curve X).

The second electrode layer 114 is located on the second light absorption layer 112. The second electrode layer 114 includes a reflective electrode material, which is preferably a metal material which has high conductivity and high reflectivity, such as aluminum, silver, or an alloy thereof.

In particular, according to the present embodiment, the second carrier transport layer 110 has a first refraction index $n1$ and a first thickness $D1$, the second light absorption layer 112 has a second refraction index $n2$ and a second thickness $D2$, and the second carrier transport layer 110 and the second light absorption layer 112 satisfy:

$$\Phi 1 + \Phi 2 - 2\pi(n1 D1 + n2 D2)/\lambda = 2m\pi$$

$\Phi 1$ represents a reflective phase difference between the second electrode layer 114 the second light absorption layer 112.

$\Phi 2$ represents a reflective phase difference between the connecting layer 108 and the second carrier transport layer 110.

$\lambda$ represents an absorption wavelength of the first light absorption layer 106.

$m$ represents 0 or an integer.

In light of the above, in the stacked photovoltaic cell module, a surface 100a of the substrate is used as a light incident surface of the stacked photovoltaic cell module, and a surface 114a of the second electrode layer 114 is used as a light reflective surface of the stacked photovoltaic cell module. Therefore, when external light L1 enters the stacked photovoltaic cell module through the light incident surface 100a, light with the first wavelength range is absorbed when passing through the first light absorption layer 106. When the light L1 arrives at the connecting layer 108, since the connecting layer 108 has a reflectivity of about 10-60%, a portion L2 of the light is reflected. In the reflected light L2, light with the first wavelength range passes through the first light absorption layer 106 again and is absorbed. Another portion L3 of the light passes through the connecting layer 108 and enters the second light absorption layer 112, so that in the light L3, light with the second wavelength range is absorbed by the second light absorption layer 112. Moreover, the light L3 is reflected by the second electrode layer 114, so that a reflected light L4 passes through the second light absorption layer 112 again, and in the light L4, light with the second wavelength range is re-absorbed by the second light absorption layer 112.

It should be noted that the second carrier transport layer 110 and the second light absorption layer 112 according to the present embodiment satisfy $\Phi 1+\Phi 2-2\pi(n1D1+n2D2)/\lambda=2m\lambda$, wherein $\Phi 1$ represents the reflective phase difference between the second electrode layer 114 the second light absorption layer 112, $\Phi 2$ represents the reflective phase difference between the connecting layer 108 and the second carrier transport layer 110, $\lambda$ represents the absorption wavelength of the first light absorption layer 106, and m represents 0 or an integer. Therefore, an optical resonance cavity is formed between the second electrode layer 114 and the connecting layer 108. In other words, when the reflected light L4 passes through the second light absorption layer 112 and arrives at the connecting layer 108 again, the reflected light L4 is reflected by the connecting layer 108 again, so that light is able to be reflected between the second electrode layer 114 and the connecting layer 108 for multiple times (as shown by the light l1 and the light l2) and is able to be absorbed by the second light absorption layer 112 for multiple times. Since light is able to be reflected between the second electrode layer 114 and the connecting layer 108 for multiple times and is able to be absorbed by the second light absorption layer 112 for multiple times, an amount of light absorbed by the second light absorption layer 112 at the second wavelength range is increased, so that amounts of light absorbed by the first light absorption layer 106 and the second light absorption layer 112 are as uniform as possible.

According to the present embodiment, the stacked photovoltaic cell module further includes an output unit 120 which has a first electrode end 120a and a second electrode end 120b. The first electrode end 120a and the second electrode end 120b are electrically connected to the first electrode layer 102 and the second electrode layer 114, respectively. According to the present embodiment, the second carrier transport layer 110 and the connecting layer 108 are in a floating state. Hence, a first photovoltaic cell unit formed by the first electrode layer 102, the first light absorption layer 106, and the connecting layer 108/the second carrier transport layer 110 is serially connected to a second photovoltaic cell unit formed by the connecting layer 108/the second carrier transport layer 110, the second light absorption layer 112, and the second electrode layer 114. In other words, carriers generated by the first light absorption layer 106 and the second light absorption layer 112 after absorbing light are able to be output to the output unit 120 through the first electrode layer 102 and the second electrode layer 114, so that generated electrical power is in a stored state. The output unit 120 may be connected to another circuit or electronic device, so that electrical power is provided to and drives the circuit or electronic device.

Figure 2:
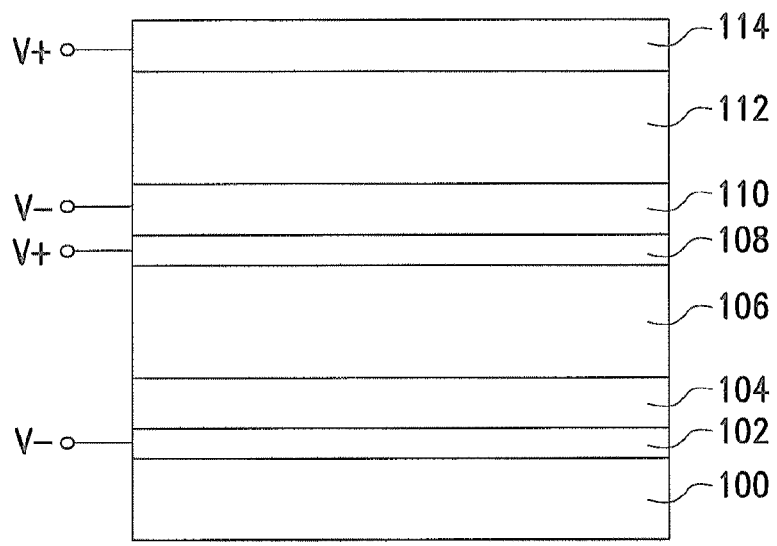
FIG. 2 is a schematic cross-sectional diagram showing a stacked photovoltaic cell module according to another embodiment of the disclosure.

According to the embodiment shown in FIG. 1, the second carrier transport layer 110 and the connecting layer 108 are in a floating state. However, the disclosure is not limited to this configuration. According to another embodiment, as shown in FIG. 2, the first electrode layer 102 and the second carrier transport layer 110 are electrically connected to the first electrode end 120a (for example, an anode end) of the output unit 120, and the second electrode layer 114 and the connecting layer 108 are electrically connected to the second electrode end 120b (for example, a cathode end) of the output unit 120. In other words, according to the embodiment shown in FIG. 2, the first photovoltaic cell unit is formed by the first electrode layer 102, the first light absorption layer 106, and the connecting layer 108, and the second photovoltaic cell unit is formed by the second carrier transport layer 110, the second light absorption layer 112, and the second electrode layer 114. The first photovoltaic cell unit is serially connected to the second photovoltaic cell unit.

Exemplary Embodiment and Comparative Embodiment

In order to illustrate the fact that the stacked photovoltaic cell module according to the disclosure has a greater output current and output power compared to a conventional photovoltaic cell module, the following describes an exemplary embodiment and a comparative embodiment.

A structure of a stacked photovoltaic cell module according to the exemplary embodiment is shown in FIG. 1, wherein the first electrode layer 102 includes indium tin oxide, the first carrier transport layer 104 includes PEDOT:PSS with a thickness of 30 nm, the first light absorption layer 106 includes the light absorption material P3HT:[60]PCBM with a thickness of 70 nm and absorbs light with a wavelength range of about 300-700 nm, the connecting layer includes silver with a thickness of about 15 nm, the second carrier transport layer 110 includes the carrier transport material PEDOT:PSS with a thickness of 30 nm, and the second light absorption layer 112 includes the light absorption material PCPDTBT:[70]PCBM with a thickness of about 80 nm and absorbs light whose wavelength is about 600-1100 nm. In particular, according to the present exemplary embodiment, the second carrier transport layer 110 and the second light absorption layer 112 satisfy $\Phi 1+\Phi 2-2\pi(n1D1+n2D2)/\lambda=2m\pi$, wherein $\Phi 1$ represents the reflective phase difference between the second light absorption layer 112 and the second electrode layer 114, $\Phi 2$ represents the reflective phase difference between the second carrier transport layer 110 and the connecting layer 108, $\lambda$ represents the absorption wavelength of the first light absorption layer 106, and m represents 0 or an integer.

A structure of a photovoltaic cell module according to the comparative embodiment is similar to the structure according to the above exemplary embodiment; a difference in between is that the reflectivity of the connecting layer is not particularly designed, and the thicknesses and the refraction index of the second carrier transport layer and the second light absorption layer do not satisfy $\Phi 1+\Phi 2-2\pi(n1D1+n2D2)/\lambda=2m\pi$.

Figure 4:
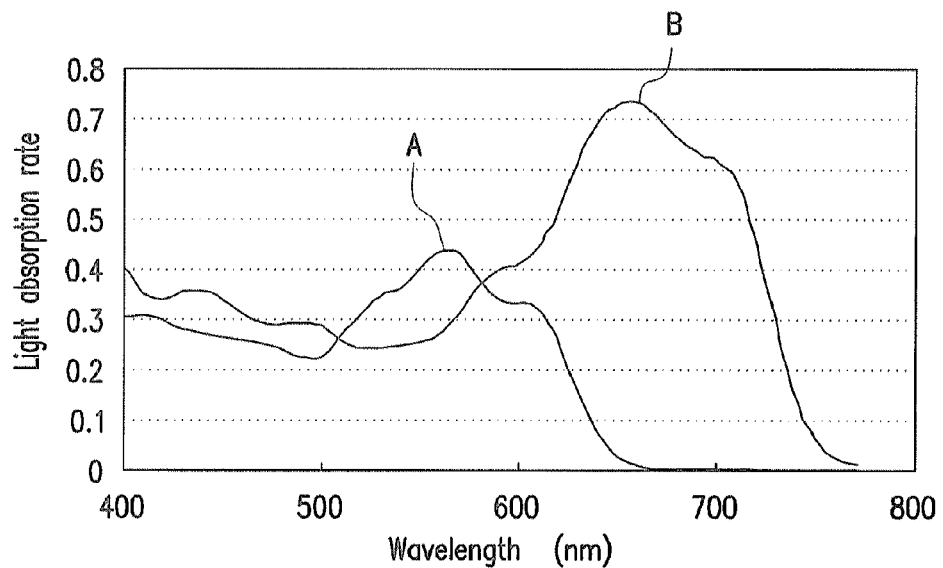
FIG. 4 is a diagram showing curves which represent light absorption efficiency and light absorption bands of a stacked photovoltaic cell module according to a comparative embodiment of the disclosure.
Figure 5:
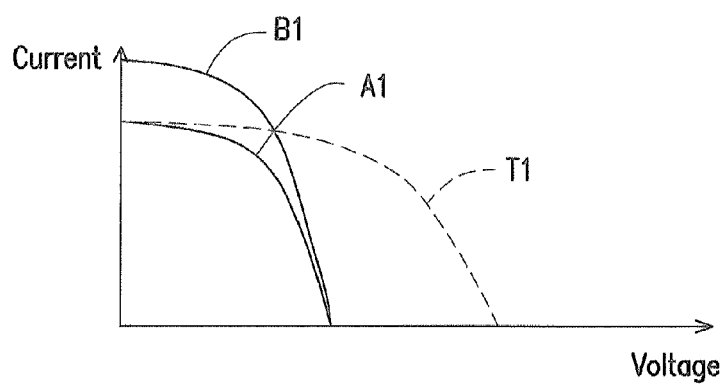
FIG. 5 is a diagram showing curves which represent relationships between voltages and currents of the stacked photovoltaic cell module according to the comparative embodiment of the disclosure.

FIG. 4 is a diagram showing curves which represent light absorption efficiency and light absorption bands of the stacked photovoltaic cell module according to the comparative embodiment of the disclosure. FIG. 5 is a diagram showing curves which represent relationships between voltages and currents of the stacked photovoltaic cell module according to the comparative embodiment of the disclosure. Please refer to FIG. 4. Curve A represents the light absorption rates and light absorption bands of the second light absorption layer according to the comparative embodiment, and curve B represents light absorption rates and light absorption bands of the first light absorption layer according to the comparative embodiment. According to FIG. 4, the amount of light absorbed by the second light absorption layer (curve A) is significantly less than the amount of light absorbed by the first light absorption layer (curve B). The reason for the above is that there is no optical resonance cavity structure between the second electrode layer and the connecting layer, so that the amount of light absorbed by the second light absorption layer is significantly less. Since the amount of light absorbed by the second light absorption layer (the curve A) is significantly less than the amount of light absorbed by the first light absorption layer (the curve B), an output current of the second photovoltaic cell unit (which has the second light absorption layer) is significantly less than an output current of first photovoltaic cell unit (which has the first light absorption layer).

Therefore, since the two photovoltaic cell units are serially connected in the photovoltaic cell module according to the comparative embodiment, a total output current of the photovoltaic cell module is limited by the photovoltaic cell unit which absorbs the least amount of light. As shown in FIG. 5, curve A1 represents a relationship between voltages and currents of the second photovoltaic cell unit (which has the second light absorption layer) of the photovoltaic cell module according to the comparative embodiment, curve B1 represents a relationship between voltages and currents of the first photovoltaic cell unit (which has the first light absorption layer) of the photovoltaic cell module according to the comparative embodiment, and curve T1 represents an overall relationship between the voltages and currents of the photovoltaic cell module according to the comparative embodiment. In the photovoltaic cell module, a total output current (a current value of curve T1) is limited by the output current (a current value of curve A1) of the second photovoltaic cell unit. Therefore, a total output power (an IV area of curve T1) of the photovoltaic cell module cannot be effectively increased.

Figure 6:
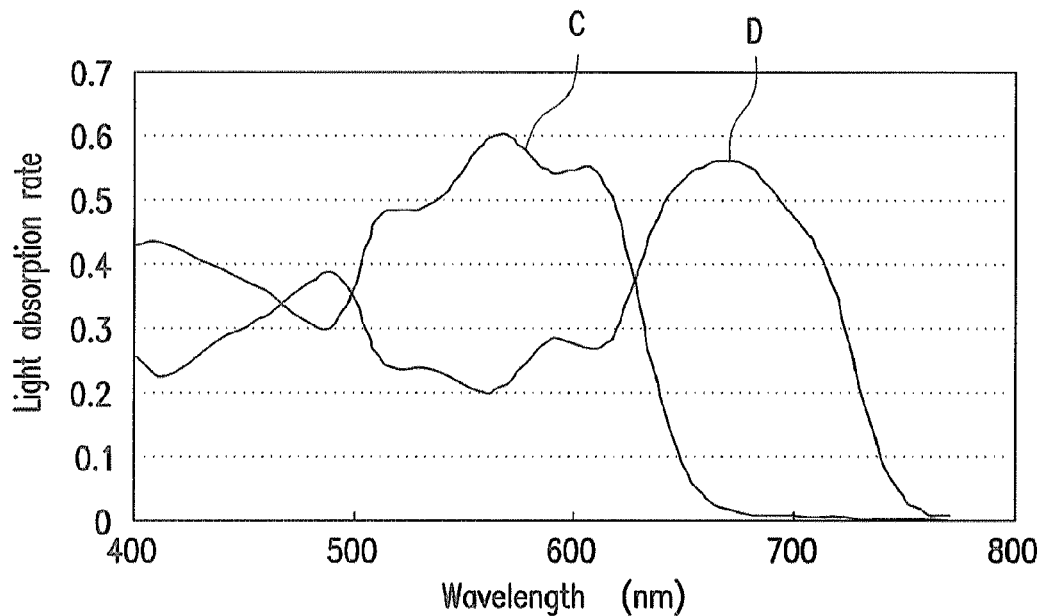
FIG. 6 is a diagram showing curves which represent light absorption efficiency and light absorption bands of a stacked photovoltaic cell module according to an exemplary embodiment of the disclosure.
Figure 7:
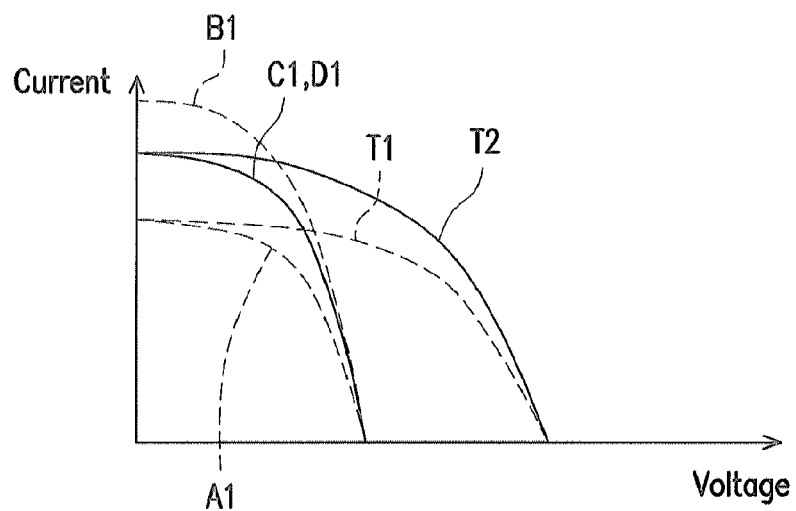
FIG. 7 is a diagram showing curves which represent relationships between voltages and currents of the stacked photovoltaic cell module according to the exemplary embodiment of the disclosure.

FIG. 6 is a diagram showing curves which represent light absorption efficiency and light absorption bands of the stacked photovoltaic cell module according to the exemplary embodiment of the disclosure. FIG. 7 is a diagram showing curves which represent relationships between voltages and currents of the stacked photovoltaic cell module according to the exemplary embodiment of the disclosure. Please refer to FIG. 6. Curve C represents the light absorption rates and light absorption bands of the second light absorption layer according to the exemplary embodiment, and curve D represents light absorption rates and light absorption bands of the first light absorption layer according to the exemplary embodiment. According to FIG. 6, the amount of light absorbed by the second light absorption layer (curve C) is comparable to the amount of light absorbed by the first light absorption layer (curve D). The reason for the above is that there is an optical resonance cavity structure between the second electrode layer and the connecting layer according to the exemplary embodiment, so that the amount of light absorbed by the second light absorption layer is significantly increased. Since the amount of light absorbed by the second light absorption layer (the curve C) according to the exemplary embodiment is significantly increased, the amount of light absorbed by the second light absorption layer (curve C) is comparable to the amount of light absorbed by the first light absorption layer (curve D).

As described above, since the two photovoltaic cell units are serially connected in the photovoltaic cell module according to the exemplary embodiment, the total output current of the photovoltaic cell module is limited by the photovoltaic cell unit which absorbs the least amount of light. According to the present embodiment, the amount of light absorbed by the second light absorption layer (curve C) is comparable to the amount of light absorbed by the first light absorption layer (the curve D), meaning that the output currents of the two photovoltaic cell units according to the present embodiment are comparable, and the output currents are greater than the output current of photovoltaic cell unit which absorbs the least amount of light according to the comparative embodiment.

As shown in FIG. 7, curve A1 represents the relationship between the voltages and currents of the second photovoltaic cell unit (which has the second light absorption layer) according to the comparative embodiment, curve B1 represents the relationship between the voltages and currents of the second photovoltaic cell unit (which has the first light absorption layer) according to the comparative embodiment, and curve T1 represents the overall relationship between the voltages and currents of the photovoltaic cell module according to the comparative embodiment, curves C1 and D1 represent relationships between voltages and currents of the two photovoltaic cell units according to the exemplary embodiment, and curve T2 represents an overall relationship between the voltages and currents of the photovoltaic cell module according to the exemplary embodiment. According to FIG. 7, the output currents (current values of curves C1 and D0 of the two photovoltaic cell units according to the present exemplary embodiment are comparable and higher than the output current (the current value of curve A1) of the second photovoltaic cell unit (which has the second light absorption layer) according to the comparative embodiment. Therefore, the total output current (a current value of curve T2) of the photovoltaic cell module according to the present exemplary embodiment is greater than the total output current (a current value of curve T1) of the photovoltaic cell module according to the comparative embodiment. Therefore, the total output power (an IV area of curve T2) of the photovoltaic cell module according to the present exemplary embodiment is greater than the total output power (the IV area of the curve T1) of the photovoltaic cell module according to the comparative embodiment.

In summary, in the stacked photovoltaic cell module according to the disclosure, the connecting layer has the reflectivity of about 10-60%, and the second carrier transport layer and the second light absorption layer $\Phi 1+\Phi 2-2\pi(n_1D_1+n_2D_2)/\lambda=2m\pi$, wherein $\Phi 1$ represents the reflective phase difference between the second electrode layer and the second light absorption layer, $\Phi 2$ represents the reflective phase difference between the second carrier transport layer and the connecting layer, $\lambda$ represents the absorption wavelength of the first light absorption layer, and m represents 0 or an integer. Since the optical resonance cavity structure is formed between the second electrode layer and the connecting layer, the light absorption rate of the second light absorption layer is increased. Therefore, external light is able to be uniformly absorbed by the first light absorption layer and the second light absorption layer after entering the photovoltaic cell module, so that the total output current and the total output power of the stacked photovoltaic cell module are increased.

It will be apparent to those skilled in the art that various modifications and variations can be made to the disclosure without departing from the scope or spirit of the disclosure. In view of the foregoing, it is intended that the disclosure cover modifications and variations of this disclosure provided they fall within the scope of the following claims and their equivalents.

What is claimed is:

1. A stacked photovoltaic cell module, comprising:
a substrate;
a first electrode layer, located on the substrate;

a first light absorption layer, located on the first electrode layer;
a connecting layer, located on the first light absorption layer, wherein the connecting layer has a reflectivity of 10-60%;
a carrier transport layer, located on the connecting layer;
a second light absorption layer, located on the carrier transport layer; and
a second electrode layer, located on the second light absorption layer to form an optical resonance cavity between the second electrode layer and the connecting layer, thereby the second light absorption layer and the carrier transport layer are located within the optical resonance cavity, and
wherein the carrier transport layer has a first refraction index n1 and a first thickness D1, the second light absorption layer has a second refraction index n2 and a second thickness D2, and the carrier transport layer and the second light absorption layer satisfy:

$$\Phi 1+\Phi 2-2\pi(n1D1+n2D2)/\lambda=2m\pi$$

$\Phi 1$ represents a reflective phase difference between the second electrode layer the second light absorption layer,
$\Phi 2$ represents a reflective phase difference between the connecting layer and the carrier transport layer,
$\lambda$ represents an absorption wavelength of the first light absorption layer, and
m represents 0 or an integer,
such that incident light entering the optical resonance cavity is reflected between the second electrode layer and the connecting layer for multiple times and is absorbed by the second light absorption layer in the optical resonance cavity for multiple times.

2. The stacked photovoltaic cell module as claimed in claim 1, wherein the connecting layer comprises a metal material.

3. The stacked photovoltaic cell module as claimed in claim 1, wherein a thickness of the connecting layer is 5-25 nm.

4. The stacked photovoltaic cell module as claimed in claim 1, wherein each of the first light absorption layer and the second light absorption layer comprises an organic light absorption material.

5. The stacked photovoltaic cell module as claimed in claim 1, wherein one of the first light absorption layer and the second light absorption layer absorbs light ranging from 300 nm to 700 nm and the other absorbs light ranging from 600 nm to 1100 nm.

6. The stacked photovoltaic cell module as claimed in claim 1, further comprising a first carrier transport layer, located between first electrode layer and the first light absorption layer.

7. The stacked photovoltaic cell module as claimed in claim 1, wherein the first electrode layer comprises a transparent electrode material.

8. The stacked photovoltaic cell module as claimed in claim 1, wherein the second electrode layer comprises a reflective electrode material.

9. The stacked photovoltaic cell module as claimed in claim 1, further comprising an output unit having a first electrode end and a second electrode end which are electrically connected to the first electrode layer and the second electrode layer, respectively.

10. The stacked photovoltaic cell module as claimed in claim 9, wherein the first electrode layer and the carrier transport layer are electrically connected to the first electrode end of the output unit, and the second electrode layer and the connecting layer are electrically connected to the second electrode end of the output unit.

11. The stacked photovoltaic cell module as claimed in claim 9, wherein both the carrier transport layer and the connecting layer are electrically connected to the first and the second light absorption layers.

12. The stacked photovoltaic cell module as claimed in claim 1, wherein the substrate is a flexible substrate.

13. The stacked photovoltaic cell module as claimed in claim 2, wherein the connecting layer comprises a metal layer.

14. The stacked photovoltaic cell module as claimed in claim 2, wherein the connecting layer is a silver layer having a thickness of about 10 nm to about 15 nm.

15. The stacked photovoltaic cell module as claimed in claim 2, wherein the connecting layer is an aluminum layer having a thickness of about 5 nm to about 10 nm.

* * * * *